United States Patent
Sinangil et al.

(10) Patent No.: US 10,803,928 B2
(45) Date of Patent: Oct. 13, 2020

(54) LOW VOLTAGE MEMORY DEVICE

(71) Applicant: Taiwan Semiconductor Manufacturing Company, Ltd., Hsinchu (TW)

(72) Inventors: Mahmut Sinangil, Hsinchu (TW); Yen-Huei Chen, Hsinchu (TW); Yen-Ting Lin, Hsinchu (TW); Hung-Jen Liao, Hsinchu (TW); Jonathan Tsung-Yung Chang, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 16/415,554

(22) Filed: May 17, 2019

(65) Prior Publication Data

US 2019/0385672 A1 Dec. 19, 2019

Related U.S. Application Data

(60) Provisional application No. 62/686,357, filed on Jun. 18, 2018.

(51) Int. Cl.
*G11C 11/419* (2006.01)
*G11C 11/418* (2006.01)

(52) U.S. Cl.
CPC ......... *G11C 11/419* (2013.01); *G11C 11/418* (2013.01)

(58) Field of Classification Search
CPC ............................ G11C 11/419; G11C 11/418
USPC ........................................................ 365/174
See application file for complete search history.

(56) References Cited

U.S. PATENT DOCUMENTS

| | | |
|---|---|---|
| 7,515,469 B1 | 4/2009 | Chen et al. |
| 9,825,636 B1 | 11/2017 | Dodrill et al. |
| 2003/0031044 A1 | 2/2003 | Higeta et al. |
| 2015/0023091 A1* | 1/2015 | Ishii ...................... G11C 11/419 365/156 |
| 2015/0357009 A1* | 12/2015 | Sinangil .................. G11C 8/08 365/156 |

FOREIGN PATENT DOCUMENTS

| | | |
|---|---|---|
| GB | 2 417 588 A | 3/2006 |
| TW | 200923955 | 6/2009 |
| TW | 201818664 A | 5/2018 |

* cited by examiner

*Primary Examiner* — Fernando Hidalgo

(57) ABSTRACT

A twelve-transistor (12T) memory cell for a memory device that includes a transmission gate, a cross-coupled inverter circuit operably connected to the transmission gate, and a tri-state inverter operably connected to the cross-coupled inverter circuit. The cross-coupled inverter includes another tri-state inverter cross-coupled to an inverter circuit. Various operations for the 12T memory cell, as well as circuitry to perform the operations, are disclosed.

20 Claims, 11 Drawing Sheets

LOW VOLTAGE MEMORY DEVICE

CROSS-REFERENCE TO RELATED APPLICATION(S)

This application claims priority to U.S. Provisional Application No. 62/686,357 filed on Jun. 18, 2018 and entitled "SRAM Bit Cell", of which the entire disclosure is hereby incorporated by reference in its entirety.

BACKGROUND

A static random access memory (SRAM) device is a type of semiconductor memory that stores data in the form of bits using bistable circuitry without the need for refreshing. Memory arrays include multiple memory cells arranged in rows and columns. Each memory cell typically includes connections to a power supply voltage and to a reference voltage. Bit lines (BL) are used for accessing a memory cell, with a word line (WL) controlling the connections to the bit lines. A word line is typically coupled to the memory cells in a row of a memory array, with different word lines provided for different rows.

Some SRAM memory cells include transistors that are connected between an upper reference potential and a lower reference potential, where one of two storage nodes stores the data to be stored (e.g., "1") and the other storage node stores complementary data (e.g., "0"). For example, one typical SRAM memory cell arrangement includes six transistors ("6T"). Each bit in the SRAM cell is stored on four of the transistors, which form two cross-coupled inverters. The other two transistors are connected to the memory cell word line to control access to the memory cell during read and write operations by selectively connecting the cell to its bit lines.

In some instances, a 6T memory cell may not operate adequately at low voltage levels because of write-ability, read-stability and read-ability issues. Alternative memory cell designs can operate at low voltage levels, but some of these designs present other issues. For example, a memory cell design may consume a larger amount of area in a memory array, or a memory cell can be challenging to manufacture based at least in part on the layout of the memory cell.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
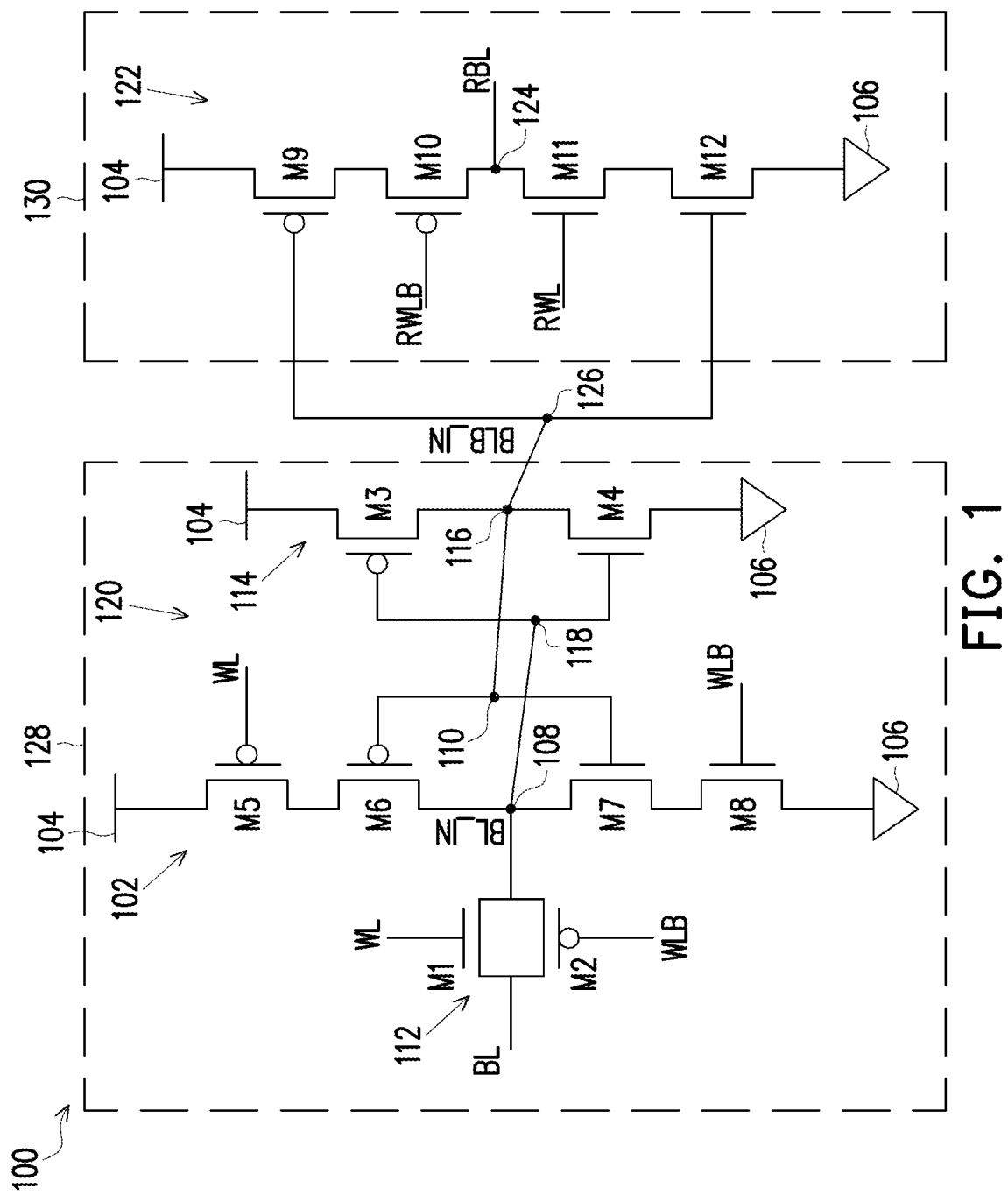
FIG. 1 illustrates a schematic diagram of a memory cell in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments described herein provide a twelve-transistor (12T) memory cell for a memory device that includes a transmission gate, a cross-coupled inverter circuit operably connected to the transmission gate, and a tri-state inverter operably connected to the cross-coupled inverter circuit. The cross-coupled inverter includes another tri-state inverter cross-coupled to an inverter circuit. The 12T memory cell is capable of operating a lower voltages compared to some other types of memory cells (e.g., 6T memory cells). The 12T memory cell supports a variety of operations, including, but not limited to, read and write operations as well as a bit-write operation, a byte-write operation, a column multiplexing operation, a testing operation, and/or power management operations. Any suitable memory device can be used, including, but not limited to, a static random-access memory (SRAM) device.

FIG. 1 illustrates a schematic diagram of a memory cell in accordance with some embodiments. The memory cell 100 includes twelve transistors M1-M12. In the illustrated embodiment, transistors M1, M4, M7, M8, M11, and M12 are n-type transistors and the transistors M2, M3, M5, M6, M9, and M10 are p-type transistors. Transistors M5, M6, M7, M8 are connected in series and configured as a tri-state inverter 102. A source of transistor M5 is operably connected to a first power supply 104 (e.g., VDD) and a source of transistor M8 is operably connected to a second power supply 106 (e.g., VSS or ground). The drain of transistor M5 is operably connected to the source of transistor M6, and the source of transistor M7 is operably connected to the drain of transistor M8. The drain of transistor M6 and the drain of transistor M7 are operably connected to each other at node 108 of the tri-state inverter 102. The gate of transistor M6 and the gate of transistor M7 are operably connected together at node 110. The gate of transistor M5 is operably connected to a word line (WL) signal line and the gate of transistor M8 is operably connected to a word line bar (WLB) signal line. The signal on WLB is a complement of the signal on WL.

Transistors M1 and M2 are connected in parallel and configured as a transmission gate 112. An input signal line to the transmission gate 112 is a bit line (BL) and an output signal line of the transmission gate 112 is operably connected to node 108. The gate of transistor M1 is operably connected to the WL signal line and the gate of transistor M2 is operably connected to the WLB signal line.

Transistors M3, M4 are connected in series and configured as an inverter 114. The source of transistor M3 is operably connected to the first power supply 104 and the source of transistor M4 is operably connected to the second power supply 106. The drain of transistor M3 is operably connected to the drain of transistor M4 at node 116. The gates of transistors M3, M4 are operably connected together at node 118. Node 116 is operably connected to node 110, and node 118 is operably connected to node 108. Thus, the tri-state inverter 102 and the inverter 114 are operably connected together and form a cross-coupled inverter circuit 120.

Transistors M9, M10, M11, M12 are connected in series and configured as a tri-state inverter 122. A source of transistor M9 is operably connected to the first power supply 104 and a source of transistor M12 is operably connected to the second power supply 106. The drain of transistor M9 is operably connected to the source of transistor M10, and the source of transistor M11 is operably connected to the drain of transistor M12. The drain of transistor M10 and the drain of transistor M11 are operably connected together at node 124 of the tri-state inverter 122. Node 124 is operably connected to a read bit line (RBL) signal line. The gates of transistors M9, M12 are operably connected together at node 126. Node 126 is operably connected to node 116. The gate of transistor M10 is operably connected to a read word line bar (RWLB) signal line and the gate of transistor M11 is operably connected to a read word line (RWL) signal line. The signal on RWLB is a complement of the signal on RWL.

Figure 2:
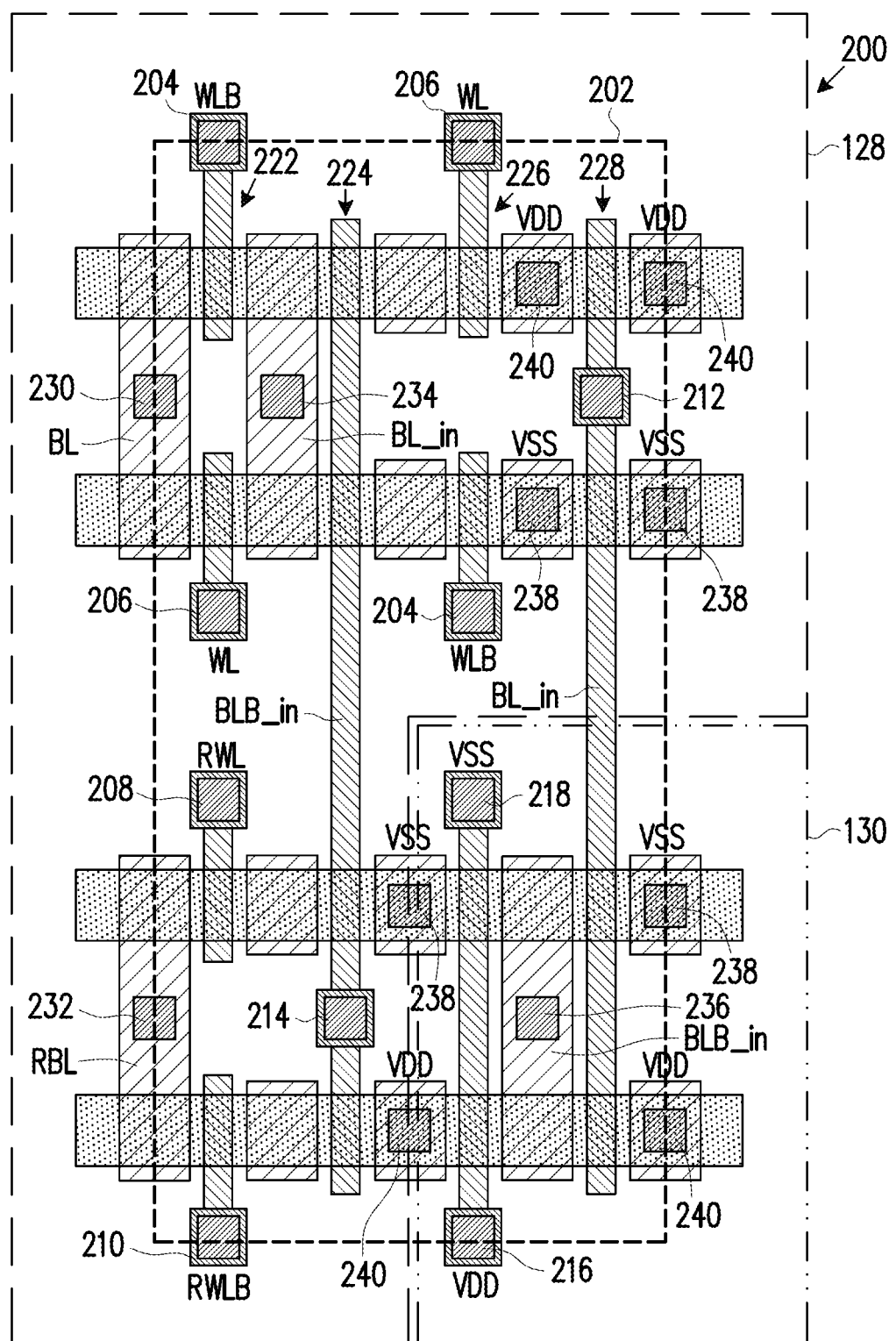
FIG. 2 depicts an example layout of the memory cell shown in FIG. 1 in accordance with some embodiments.

FIG. 2 depicts an example layout of the memory cell shown in FIG. 1 in accordance with some embodiments. In the illustrated embodiment, the column signal lines of the memory cell, such as the bit line signal lines (e.g., BL and BLB), can be in the first metal layer, and the row signal lines, such as the word signal lines (e.g., WL and WLB), may be in the second metal layer. The row signal lines are not shown in FIG. 2 for clarity.

The boundary of the memory cell 200 is indicated by the dashed line 202. Contacts 204, 206, 208, 210, 212, 214, 216, 218 provide a conductive contact between a non-metal layer 220, such as a polysilicon layer, and a metal layer (e.g., a second metal layer). The metal layer can include the word signal lines WLB, WL, RWL, and RWLB, as well as signal lines for BL_in, BLB-in, and the first and second power supplies (e.g., VDD and VSS). In the illustrated embodiment, the memory cell 200 is a four non-metal wide memory cell in that the non-metal layer is patterned to include four non-metal lines 222, 224, 226, 228 (e.g., four polysilicon lines). Other embodiments can include any suitable number of non-metal lines, such as, for example, six or seven lines.

One advantage to the four non-metal lines is the length of the bit lines are shorter compared to memory cells that have a different number of non-metal lines. Shorter bit lines have less capacitance. Additionally, the operations of the memory cell (e.g., read or write) can execute more quickly and the memory cell may operate at lower voltages.

Contacts 230, 232, 234, 236, 238, 240 provide a conductive contact between a metal layer (e.g., a first metal layer) and another metal layer (not shown). The contacts are provided for conductive connections between the metal signal lines BL, RBL, BL_in, BLB-in lines and the first and second power supplies (e.g., VDD and VSS) and another metal signal line.

Oxide regions are continuous between the memory cells in a memory array. In embodiments where the memory array includes sub-arrays, the oxide regions can be continuous in each sub-array, or the oxide regions may be continuous in the entire memory array.

A transistor with a higher threshold voltage can provide more current but may experience higher leakage with the transistor is turned off. A transistor with a lower threshold voltage can provide less current but may experience lower leakage with the transistor is turned off. In some embodiments, some or all of the transistors in the memory cell 100, 200 can have different levels of doping to produce a different threshold voltage (higher or lower threshold voltage). Some of the transistors in the memory cell can be designed to be faster with a lower threshold voltage.

In one aspect, the transistors in the read port of the memory cell 100, 200 can operate at a different threshold voltage than the transistors in the write port of the memory cell 100, 200. For example, in one embodiment, a memory cell can be designed to have the transistors in the read port operate faster than the transistors in the write port. In this example embodiment, the transistors in the read port can operate at a lower threshold voltage compared to the threshold voltage of the transistors in the write port (transistors in the write port can operate a higher threshold voltage relative to the threshold voltage of the transistors in the read port). In some instances, the transistors in the read port may have higher leakage current than the transistors in the write port, but the total leakage current for the read port can still be less than having all of the transistors in the memory cell (both read and write ports) operate at a lower threshold voltage.

With reference to FIGS. 1 and 2, the transmission gate 112 and the cross-coupled inverter circuit 120 (e.g., the tri-state inverter 102 and the inverter 114) form a write port 128 and the tri-state inverter 122 is a read port 130. The transistors in the write port can operate at a first threshold voltage $V_{T1}$ and the transistors in the read port may operate at a second threshold voltage $V_{T2}$, where $V_{T1}=V_{T2}$, $V_{T1}<V_{T2}$, or $V_{T1} > V_{T2}$, depending on the design of the transistors (e.g., the doping levels for the transistors). Having the threshold voltage of the transistors in one port, such as the read port, operate at a lower voltage compared to the threshold voltage of the transistors in the other port (e.g., the write port), can produce a memory cell that has the same or higher performance for an operation (e.g., a faster read operation) and lower leakage current compared to a memory cell where all of the transistors operate at a higher threshold voltage.

Figure 3:
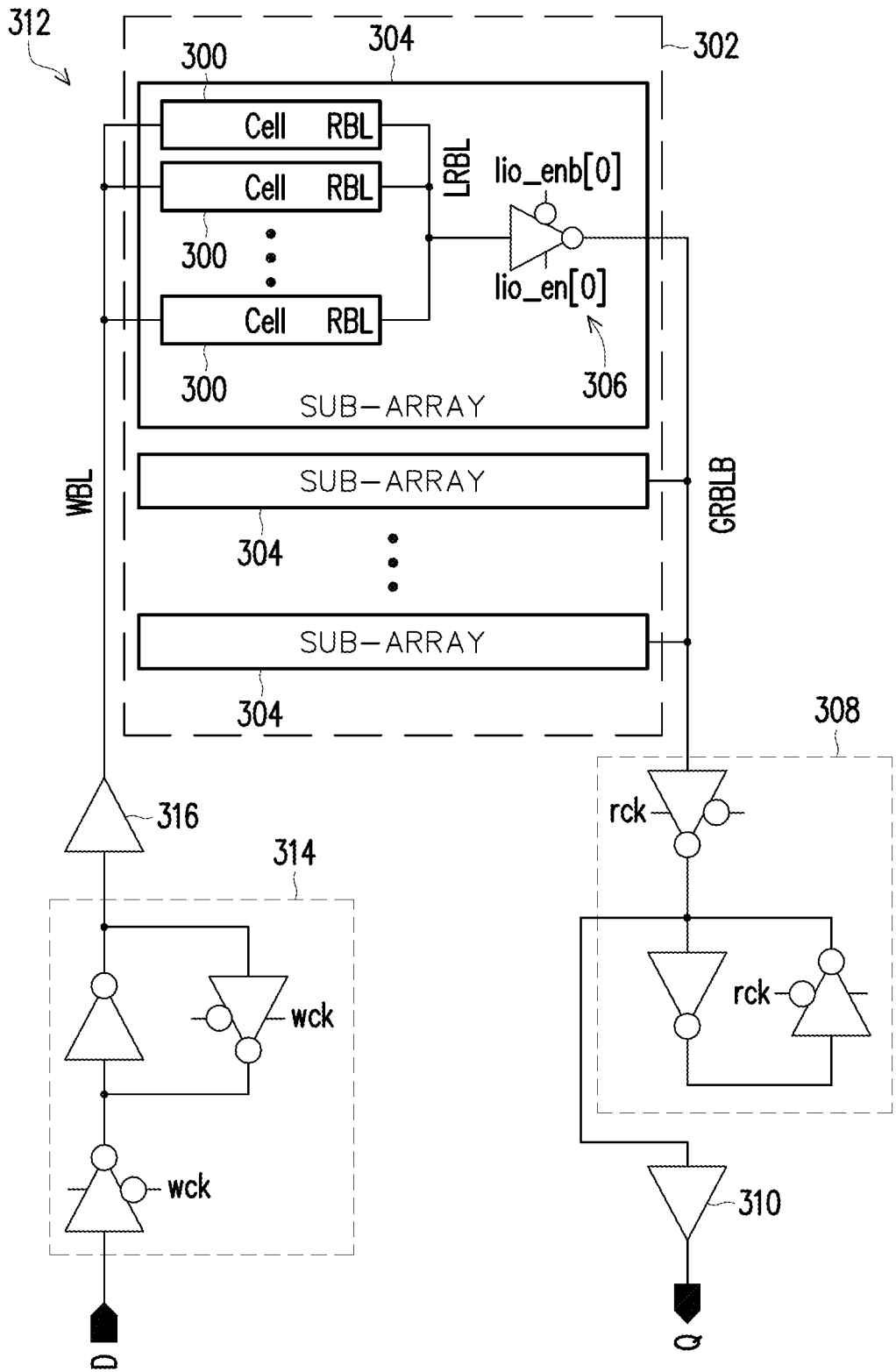
FIG. 3 illustrates a block diagram of an example memory device in accordance with some embodiments.

FIG. 3 illustrates a block diagram of an example memory device in accordance with some embodiments. The example memory device uses a hierarchical structure for each read path in the memory device. In other embodiments, a read path can have a non-hierarchical structure (e.g., no global read bit line). The performance criteria for a memory device can determine whether a hierarchical or non-hierarchical structure is used. For brevity, the enable and disable signals for the buffers, the input data latch, and the output data latch, as well as the clock signals (rck, wck) of the output and input data latches, are not described.

Each memory cell 300 in the memory array 302 can be configured as a 12T memory cell shown in FIG. 1. The memory cells 300 are grouped into sub-arrays 304. In the example hierarchical structured read path, each memory cell 300 in a sub-array 304 is operably connected to a local read bit line (LRBL). The LRBLs are operably connected to an input of a driver circuit 306, and the output of the driver circuit 306 is operably connected to a global read bit line (GRBLB). The output of the driver circuit 306 (e.g., the GRBLB) is operably connected to an input of an output storage device 308. The output of the output storage device 308 is operably connected to an input of an output driver circuit 310. The output of the output driver circuit 310 is the output data Q. Any suitable output storage device can be used. For example, the output storage device 308 can be a latch circuit.

A write path in the memory device 312 can be a non-hierarchical read path. In the write path, input data D is received at an input of an input storage device 314. The output of the input storage device 314 is operably connected to an input of an input driver circuit 316. The output of the input driver circuit 316 is a word bit line (WBL) that is operably connected to each cell in the memory array 302. Any suitable input storage device can be used. For example, the input storage device 314 can be a latch circuit.

Additionally, any suitable driver circuit and latch circuit can be used for the driver circuits 306, 310, 316 and the storage devices 308, 314, respectively. For example, the input and the output storage devices 308, 314 can be implemented with an output of a first tri-state driver connected to an input of an inverter circuit, the output of the inverter circuit connected to an input of a second tri-state driver circuit, and the output of the second tri-state driver circuit connected to the input of the inverter circuit. The GRBLB is connected to the input of the first tri-state driver circuit. The driver circuit 306 can be a tri-state driver circuit.

In some embodiments, the memory device can provide a bit-write operation and/or a byte-write operation. A bit-write operation allows input data to only be written to select memory cells during a write operation. The data that is currently stored in the non-select memory cells does not change (e.g., is rewritten to the memory cells). A byte-write operation allows input data to only be written to select bytes of memory cells during a write operation. The data that is stored in the non-selected bytes of memory cells do not change (e.g., is rewritten to the bytes of memory cells). Whether the input data or the stored data is written to a memory cell is based on mask data that indicates whether input data or stored data is to be written to the memory cell.

Figure 4:
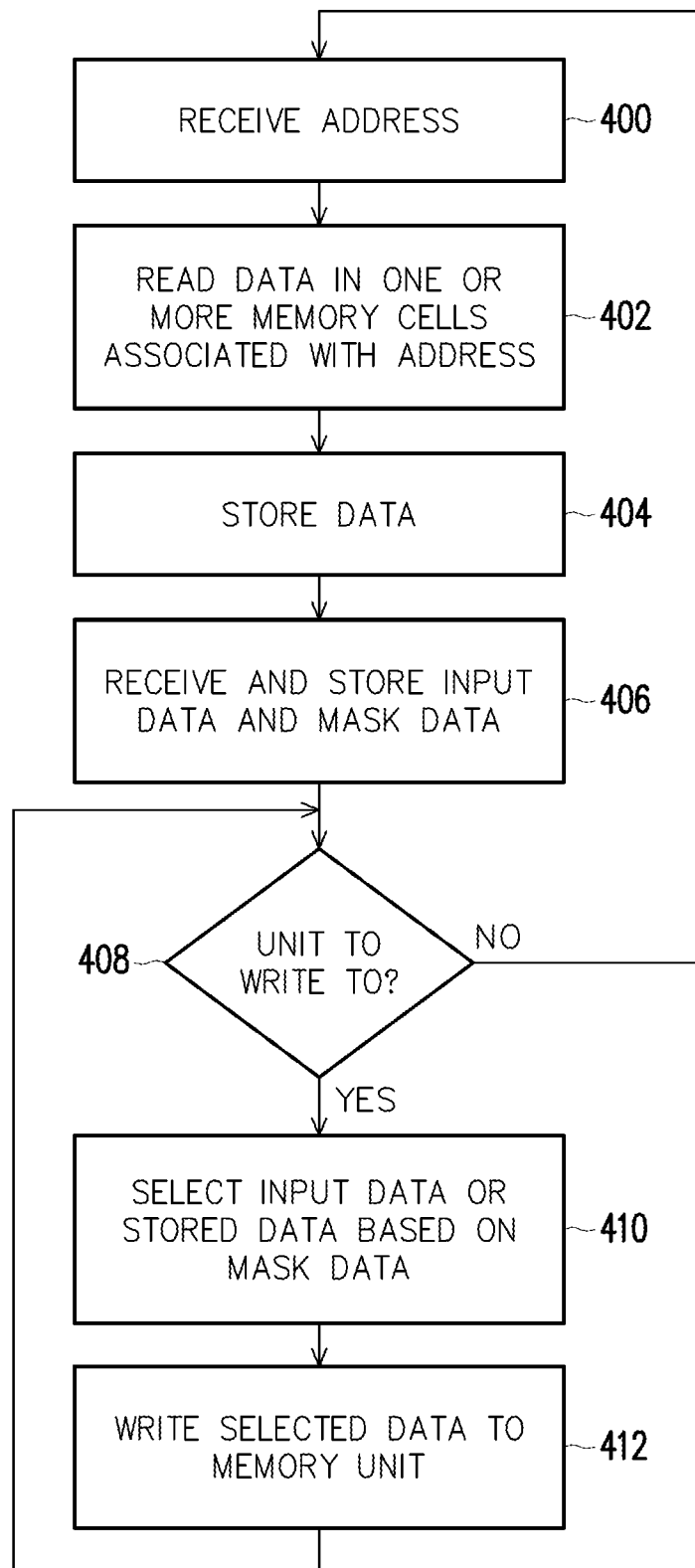
FIG. 4 depicts a flowchart of an example method of writing input data to one or more memory cells.

FIG. 4 depicts a flowchart of an example method of writing input data to one or more memory cells using bit-write or byte-write operations. As used herein, the phrase "memory unit" refers to one memory cell or a byte of memory cells. Initially, as shown in block 400, an address for a write operation to one or more memory units is received. For example, the address can be associated with individual memory cells in a memory array (e.g., a row of memory cells), or the address may be associated with one or more bytes of memory cells in the memory array. The data stored in each of the one or more memory units associated with the address is read and stored in a storage device (blocks 402 and 404). Any suitable storage device can be used to store the data. For example, a data latch circuit can be included in the output circuitry for each memory cell and used to store the data.

Input data and mask data are received and stored at block 406. The input data can be a single bit or multiple bits. For bit-write operations, the mask data may be a single bit or multiple bits, where each bit in the mask data is associated with a particular bit in the input data and a particular memory cell specified in the address. For example, eight bits of input data and eight bits of mask data may be received at block 406, with each bit in the mask data associated with a respective bit in the input data to be written to a respective memory cell specified in the address.

For byte-write operations, the mask data can be a single bit or multiple bits, where each bit in the mask data is associated with a particular byte of input data to be written to a particular byte of memory cells specified in the address. For example, sixteen bits of input data (or two bytes of input data) may be received at block 406. The mask data can be two bits, with each bit in the mask data associated with a respective byte of input data to be written to a particular byte of memory cells specified in the address.

A determination is made at block 408 as to whether data is to be written to a memory unit. If not, the process returns to block 400, where the method waits to receive another address. When data is to be written to a memory unit, the method passes to block 410 where either the input data that was received at block 406 for the memory unit, or the stored data that was read from the memory unit and stored at blocks 402, 404, is selected based on the mask data associated with the memory unit. The selected data (the input data or the stored data) is then written to the memory unit at block 412.

Figure 5:
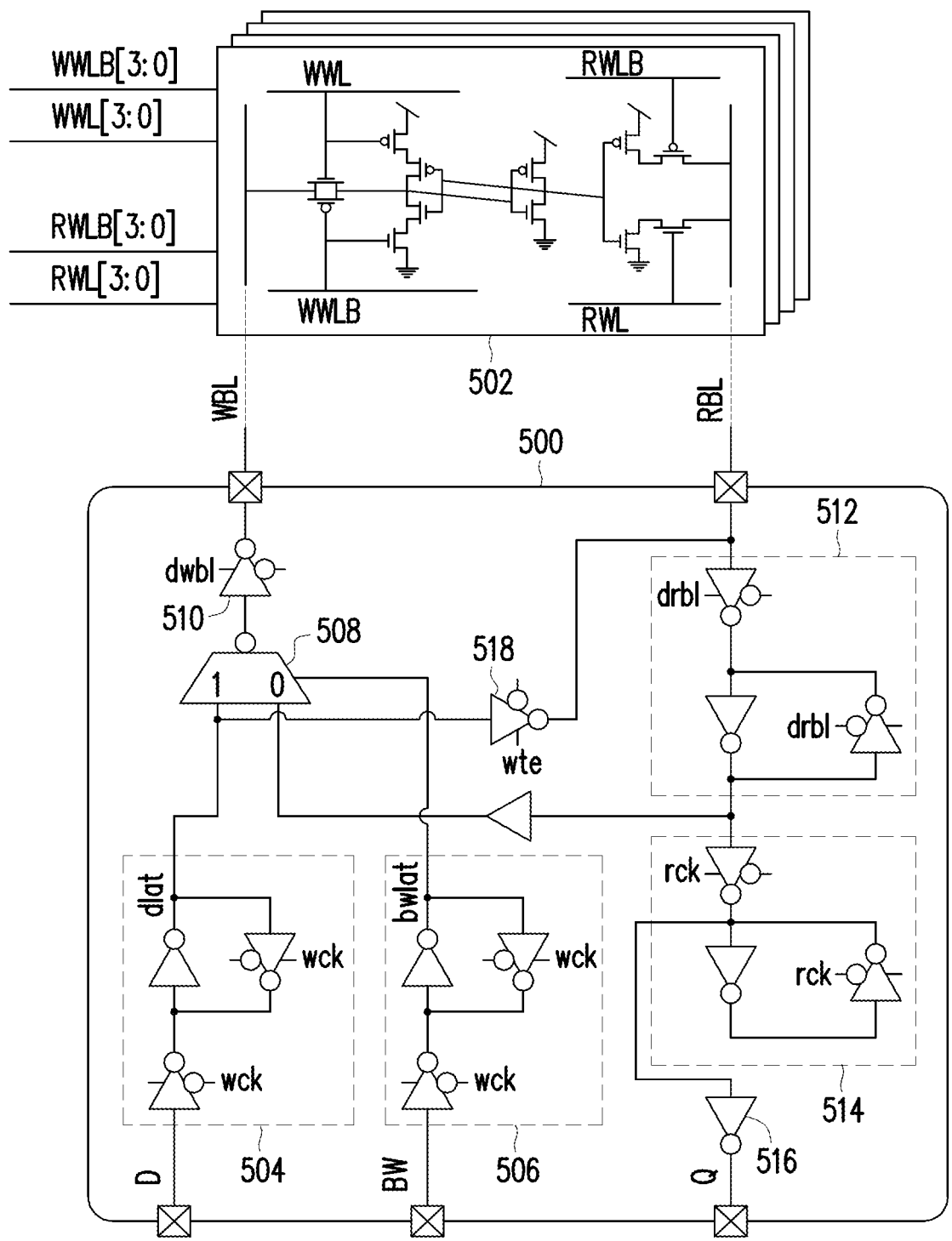
FIG. 5 illustrates a schematic diagram of unit write circuitry suitable for use in a memory device that performs the method shown in FIG. 4 in accordance with some embodiments.

FIG. 5 illustrates a schematic diagram of unit write circuitry suitable for use in a memory device that performs the method shown in FIG. 4 in accordance with some embodiments. As used herein, the phrase "unit write" refers to circuitry that is configured to perform bit-write operations and/or byte-write operations. In one aspect, the unit write circuitry 500 is operably connected to a column of memory cells in a memory array. Thus, when a memory array includes a first column of memory cells and a second column of memory cells, a first unit write circuitry 500 is operably connected to the first column of memory cells and a second unit write circuitry 500 is operably connected to the second column of memory cells.

The WWL, WWLB, RWL, RWLB, WBL, and RBL represent the write word line (WWL), the write word line bar (WWLB), the read word line (RWL), the read word line bar (RWLB), the write bit line (WBL), and the read bit line (RBL), respectively. For brevity, only some of these signals are discussed in detail.

Each memory cell 502 in a column of memory cells can be implemented as a 12T memory cell illustrated in FIG. 1. The unit write circuitry 500 is operably connected to each memory cell in the column via WBL (e.g., the BL in FIG. 1) and the read bit line (RBL) (e.g., node 124 of the tri-state inverter 122 in FIG. 1). In the write path, input data D (e.g., a bit) is received at an input of an input storage device 504, which stores the input data D. Mask data BW is received at an input of a mask storage device 506, which stores the mask data. The inputs of a select circuit 508 are operably connected to the output (dlat) of the input storage device 504 and the output of a memory cell storage device 512 in the read path. The output (bwlat) of the mask storage device 506 is operably connected to a select input of the select circuit 508. The output of the select circuit 508 is operably connected to an input of a driver circuit 510, and the output of the driver circuit 510 is operably connected to WBL.

In a read path, the RBL is operably connected to an input of the memory cell storage device 512, which stores the data read from the memory cell 502 when a bit-write or a byte-write operation is performed. The output of the memory cell storage device 512 is operably connected to an input of an output storage device 514. The output of the output storage device is operably connected to an inverter circuit 516. The output of the inverter circuit 516 is the data output Q.

When a bit-write or a byte-write operation is performed, the RWL and the RWLB signals are used to select a particular row in the memory array, and the RBL signal is used to select a particular column in the memory array. The data stored in the memory cell 502 is read from the memory cell 502 and stored in the memory cell storage device 512. The input data D for the memory cell 502 is stored in the input storage device 504 and the mask data BW associated with the input data for the memory cell 502 is stored in the mask storage device 506. Based on the polarity of the mask data (e.g., a 1 or a 0), the select circuit 508 outputs either the input data or the stored data. The selected data is then written to the memory cell 502. For example, when the mask data is a "1", the select circuit 508 can output the input data and the input data is written to the memory cell 502. Alternatively, when the mask data is a "0", the select circuit 508 may output the stored data and the stored data is written to the memory cell 502. Other embodiments are not limited to this configuration of mask data. In some embodiments, the input data is written to the memory cell 502 when the mask data is "0" and the stored data is written to the memory cell 502 when the mask data is "1".

Any suitable driver circuit and storage device can be used for the driver circuits 510, 518 and the storage devices 504, 512, 514, respectively. For example, the storage devices 504, 512, 514 can each be a latch circuit. The latch circuit may be implemented with an output of a first tri-state driver connected to an input of an inverter circuit, the output of the inverter circuit connected to an input of a second tri-state driver circuit, and the output of the second tri-state driver circuit connected to the input of the inverter circuit. The driver circuits 510, 518 can be tri-state driver circuits.

Figure 6:
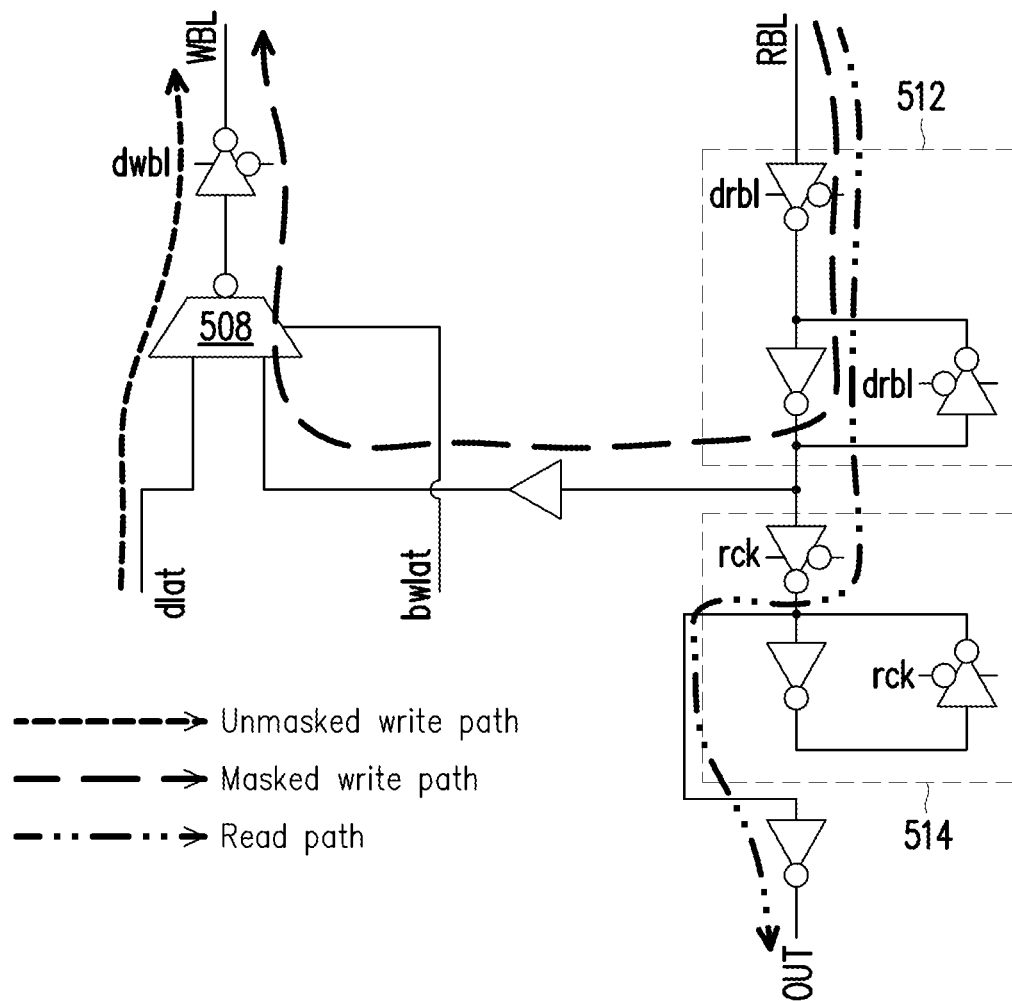
FIG. 6 depicts read and write paths for the read and write circuitry shown in FIG. 5 in accordance with some embodiments.

FIG. 6 depicts read and write paths for the read and write circuitry shown in FIG. 5 in accordance with some embodiments. An unmasked write path includes the select circuit 508 outputting the input data and the input data being written to the memory cell (not shown in FIG. 6). A masked write path includes the memory cell storage device 512 outputting the data read from the memory cell (the "stored data"), the select circuit 508 outputting the stored data, and the stored data being written to the memory cell. The read path includes the memory cell storage device 512 storing the data read from the memory cell and the output storage device 514 storing the data read from the memory cell and outputting the data as the output data.

Figure 7:
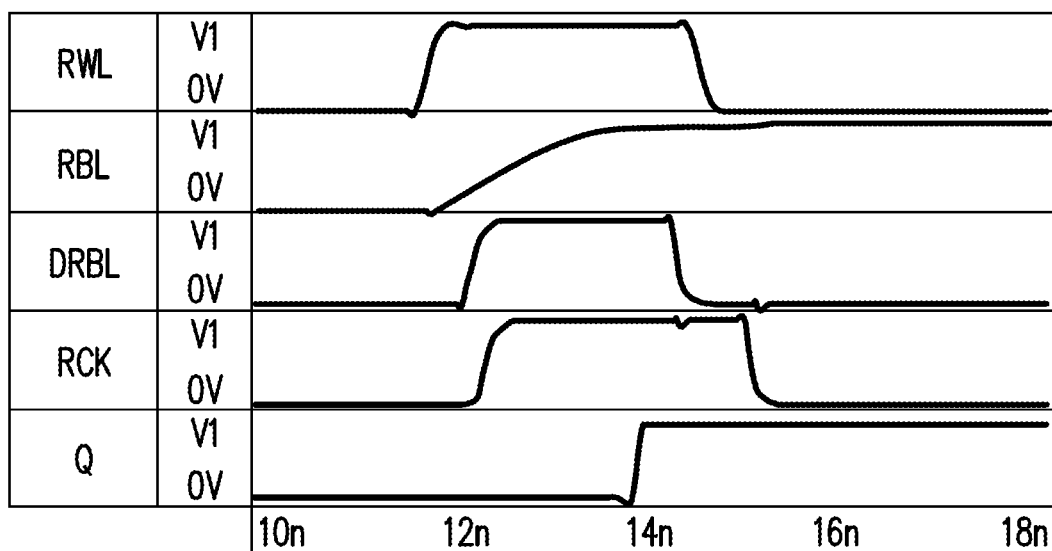
FIG. 7 illustrates an example timing diagram for a read operation in the memory device shown in FIG. 5 in accordance with some embodiments.

FIG. 7 illustrates an example timing diagram for a read operation in the memory device shown in FIG. 5 in accordance with some embodiments. At the start of the read operation, the signal level on the read word line (RWL) goes to high level (e.g., V1) and the signal level on the read bit line (RBL) transitions from a low level (e.g., 0 V) to the high level. While the signal level on the RBL is transitioning to the high level, the enable signal (drbl) of the tri-state driver circuits in the memory cell storage device 512 go to the high level and the clock signal (rck) of the tri-state driver circuits in the output storage device 514 goes to the high level. When the signal level on RBL is substantially at the high level, the output storage device 514 outputs the data read from the memory cell (Q) and the signal levels of the RWL, drbl, and the rck return to the low level.

Figure 8:
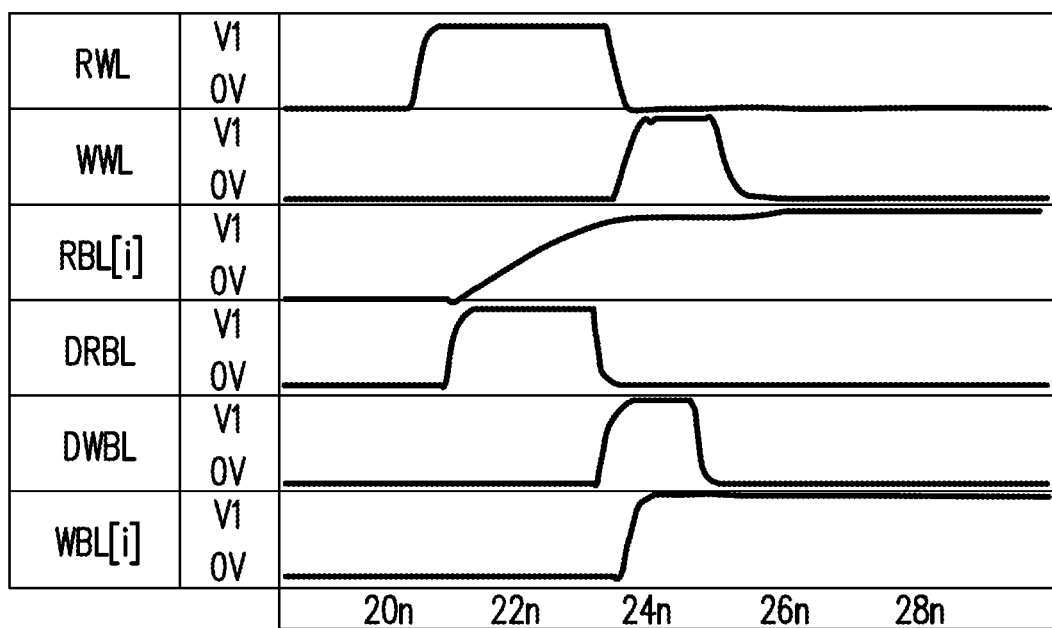
FIG. 8 depicts an example timing diagram for a masked write operation in the memory device shown in FIG. 5 in accordance with some embodiments.

FIG. 8 depicts an example timing diagram for a masked write operation in the memory device shown in FIG. 5 in accordance with some embodiments. At the start of the masked write operation, the signal level on the read word line (RWL) goes to high level (e.g., V1) and the signal level on the read bit line (RBL(i)) for memory cell i transitions from a low level (e.g., 0 V) to the high level. While the signal level on the RBL is transitioning to the high level, the enable signal (drbl) of the tri-state driver circuits in the memory cell storage device 512 goes to the high level for a period of time and then returns to the low level. When drbl returns to the low level, the enable signal (dwbl) of the tri-state driver circuit 510 goes to the high level. When the signal level of the RBL(i) is substantially at the high level and the signal level on the RWL returns to the low level, and while the dwbl is at the high level, the signal level of the word bit line (WBL(i)) for memory cell i goes to the high level and the data stored in the memory cell storage device 510 is written to the memory cell i. The signal levels on the WWL and the dwbl then return to the low level.

Figure 9:
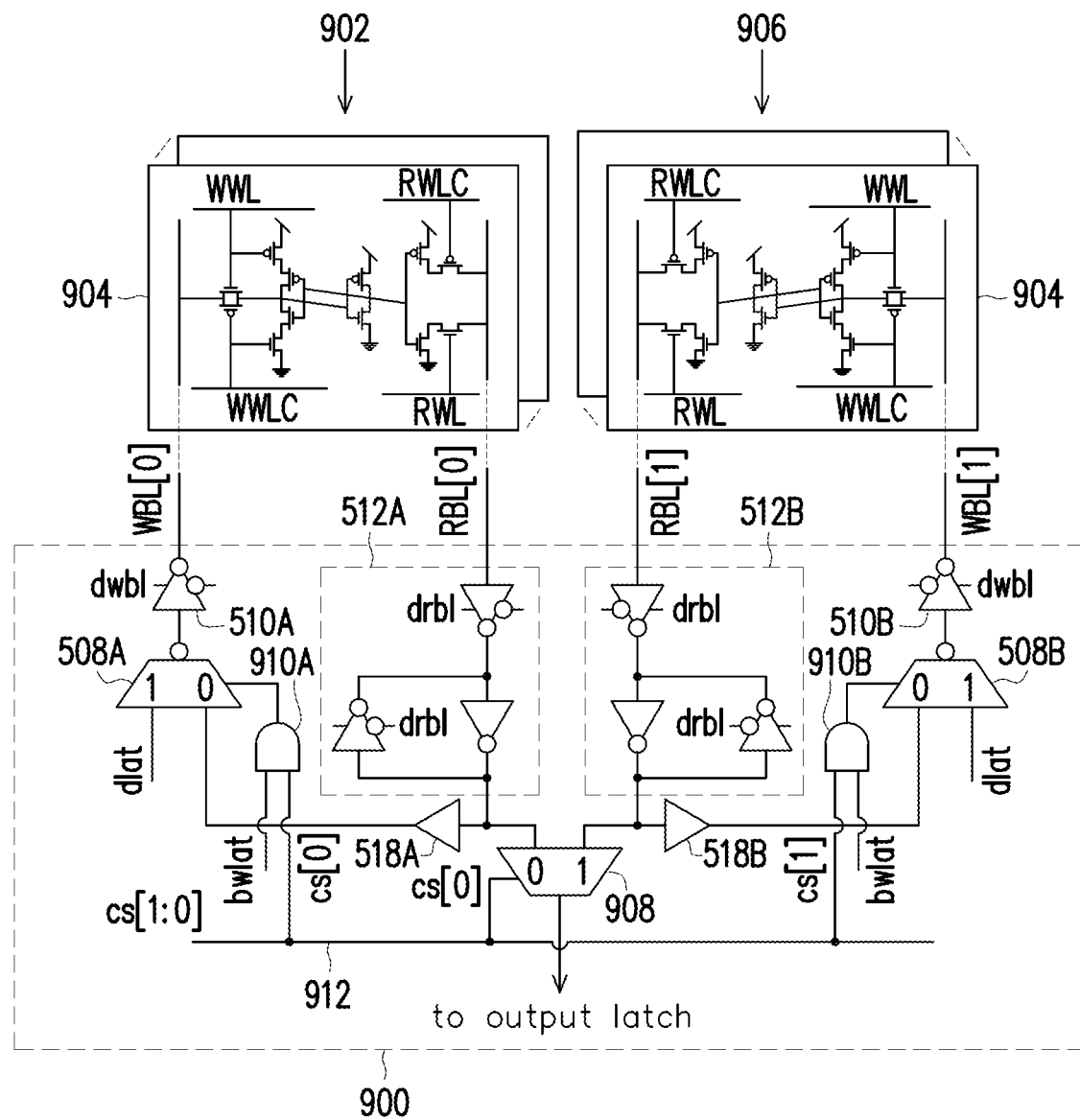
FIG. 9 illustrates a schematic diagram of a memory device that is configured to perform column multiplexing in accordance with some embodiments.

FIG. 9 illustrates a schematic diagram of a memory device that is configured to perform column multiplexing in accordance with some embodiments. In the illustrated embodiment, column multiplexing is described in conjunction with two columns. Each row in a memory array corresponds to a particular address. For example, if a row includes sixteen memory cells, the address will be sixteen bits. For column multiplexing, the sixteen memory cells are grouped into two groups and each physical row now corresponds to two addresses (e.g., eight bits in one address is associated with eight memory cells and eight bits in the other address is associated with the other eight memory cells).

Other embodiments are not limited to two columns. Column multiplexing can be performed for $2^n$ columns in a memory array, where n is equal to or greater than one and the value of $2^n$ is less than or equal to the number of bits in an address. For example, for four columns, sixteen memory cells are grouped into four groups and each row now corresponds to four addresses (e.g., each address has four bits and is associated with a respective one of the four groups). For eight columns, sixteen memory cells are grouped into eight groups and each physical row now corresponds to eight addresses (e.g., each address has two bits and is associated with a respective one of the eight groups). Since the address includes sixteen bits, column multiplexing can be used with sixteen columns with the row corresponding to sixteen addresses (each memory cell is associated with a particular bit in the address and a particular memory cell in the sixteen memory cells).

In some instances, data is written to each memory cell in row during a write operation. Thus, the number of addresses associated with a memory array is based on the number of rows in the memory array. For example, if a memory array has sixty-four rows and each row has sixteen memory cells, a memory array that does not perform column multiplexing is associated with sixty-four addresses (one address for each row). Column multiplexing provides a better aspect ratio and can increase the depth of a memory array. For example, with a memory array that performs column multiplexing using four columns in the memory array, each row of sixteen memory cells is grouped into four groups of four memory cells, and each group is associated with a given address. Thus, the number of addresses associated with the memory array increases from sixty-four to 256 (64 rows×4 addresses per row). In another example embodiment a memory device that performs column multiplexing using sixteen columns in the memory array, each memory cell in each row is associated with a given address. Thus, the number of addresses associated with the memory cell increases from sixty-four to 1,024 (64 rows×16 addresses per row). Column multiplexing provides a memory array with the ability to write to, or read from, a subset of the memory cells in each row instead of writing to an entire row of memory cells. The subset can be a single memory cell or a group of memory cells, where the number of memory cells in the group is less than the number of memory cells in a row.

In FIG. 9, column select circuitry 900 is operably connected to a first column 902 of memory cells 904 (column [0]) and a second column 906 of memory cells 904 (column [1]). The column select circuitry 900 includes the unit write circuitry 500 shown in FIG. 5 for each column 902, 906 along with select circuit 908 and circuits 910A, 910B. For clarity, the driver circuit 510, the select circuit 508, the memory cell storage device 512, and the driver circuit 518 from each unit write circuitry 500 are shown in FIG. 9 and the input storage device 504, the mask storage device 506, and the output latch 514 are not shown. The word bit line (WBL) of the first column 902 is operably connected to the driver circuit 510A and the read bit line (RBL) is operably connected to the memory cell storage device 512A. The word bit line (WBL) of the second column 906 is operably connected to the driver circuit 510B and the read bit line (RBL) is operably connected to the memory cell storage device 512B.

A column select signal line 912 is operably connected to first inputs of the logic circuits 910A, 910B and to a select input of the select circuit 908. Any suitable logic circuit can be used. For example, in the illustrated embodiment, the logic circuits 910A, 910B are implemented as AND circuits.

The output of the memory cell storage device 512A is operably connected to a first input of the select circuit 908 and the output of the memory cell storage device 512B is operably connected to a second input of the select circuit 908. The output of the input storage device (not shown in FIG. 9; see 504 in FIG. 5) that stores input data to be written to a memory cell in the first column 902 is operably connected to a second input of the logic circuit 910A. The output of the input storage device (not shown in FIG. 9; see 504 in FIG. 5) that stores input data to be written to a memory cell in the second column 906 is operably connected to a second input of the logic circuit 910B.

During a write operation, a regular write operation can be performed with the selected column in that the input data is written to a memory cell in the selected column. With the unselected column, the data stored in the memory cell storage device 512 is written to a memory cell in the selected column. For a write operation, a column select signal is provided on the column select signal line 912. The column select signal and the mask data (bwlat) from the mask storage device that stores the mask data for the first column (not shown in FIG. 9; see 506 in FIG. 5) are received by the logic circuit 910A. The column select signal and the mask data (bwlat) from the mask storage device that stores the mask data for the second column (not shown in FIG. 9; see 506 in FIG. 5) are received by the logic circuit 910B. The output of the logic circuits 910A, 910B are operably connected to the select input of the select circuits 508A, 508B. Based on the outputs of the logic circuits 910A, 910B, the select circuit 508A, 508B select either the input data (dlat) or the data stored in the memory cell storage devices 512A, 512B for writing to a memory cell.

During a read operation, the data stored in memory cells in both columns can be read. During the read operation, both memory cell storage devices 512A, 512B are enabled and store the data read from the memory cells. Based on the column select signal line 912, the data stored in the memory cell storage devices 512A, 512B is multiplexed from the memory cell storage devices 512A, 512B to a respective output storage device (not shown in FIG. 9; see 514 in FIG. 5) and provided as output data Q.

Figure 10:
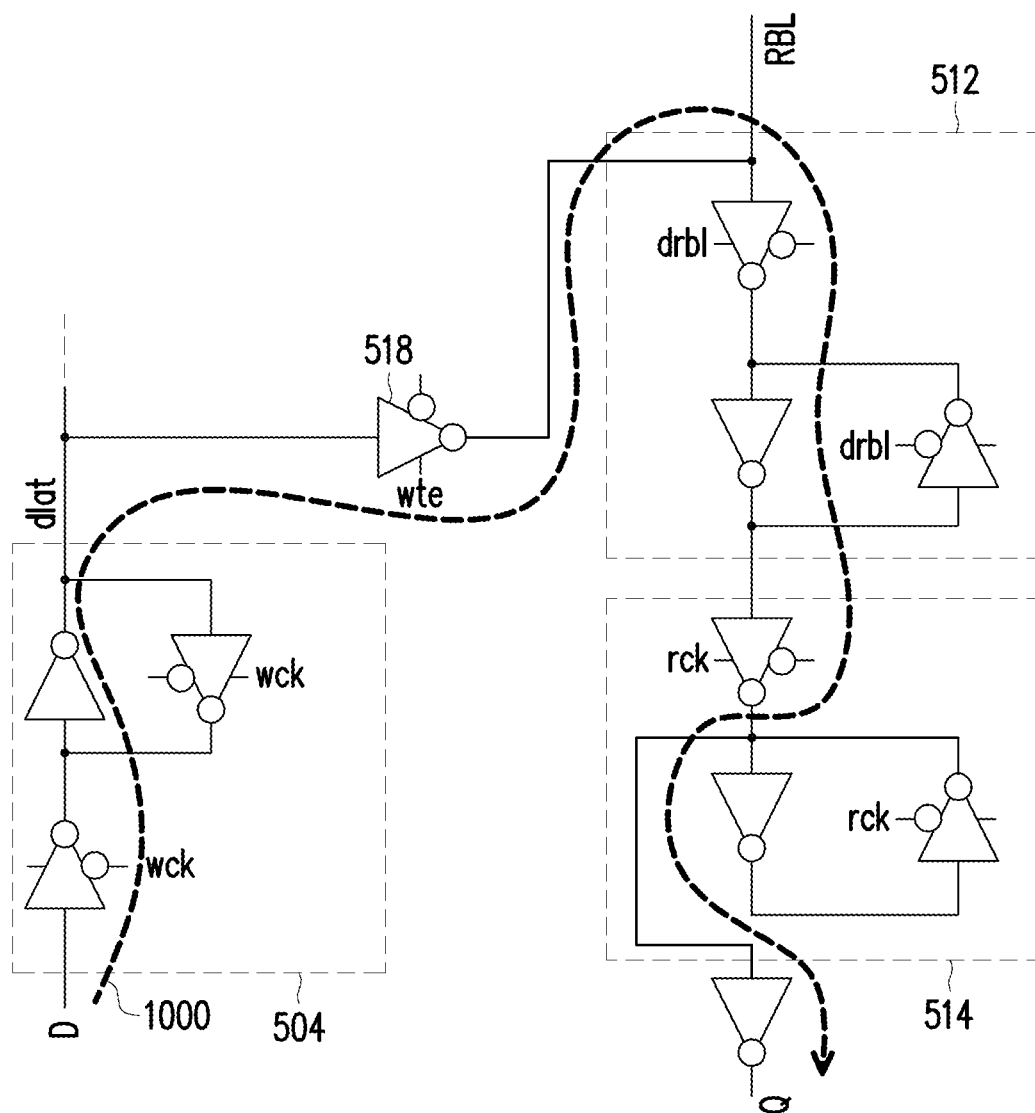
FIG. 10 depicts an example schematic diagram showing a write-through operation in accordance with some embodiments.

FIG. 10 depicts an example schematic diagram showing a write-through operation in accordance with some embodiments. Write-through operations can be performed to test the read path in the memory unit circuitry 500 (FIG. 5) and/or the column select circuitry 900 (FIG. 9). The memory cells in the memory array are not accessed during the test.

A test path is shown in FIG. 10 by the dashed line 1000. The test path includes the input storage device 504, the driver circuit 518, the memory cell storage device 512, and the output storage device 514. Test data (D) is received by, and stored in, the input storage device 504. The driver circuit 518 is enabled and the test data is stored in the memory cell storage device 512. The test data is then stored in the output storage device 514 and provided as output data (Q). The output data (Q) should be the same test data that was input data (D) into the test path.

Figure 11:
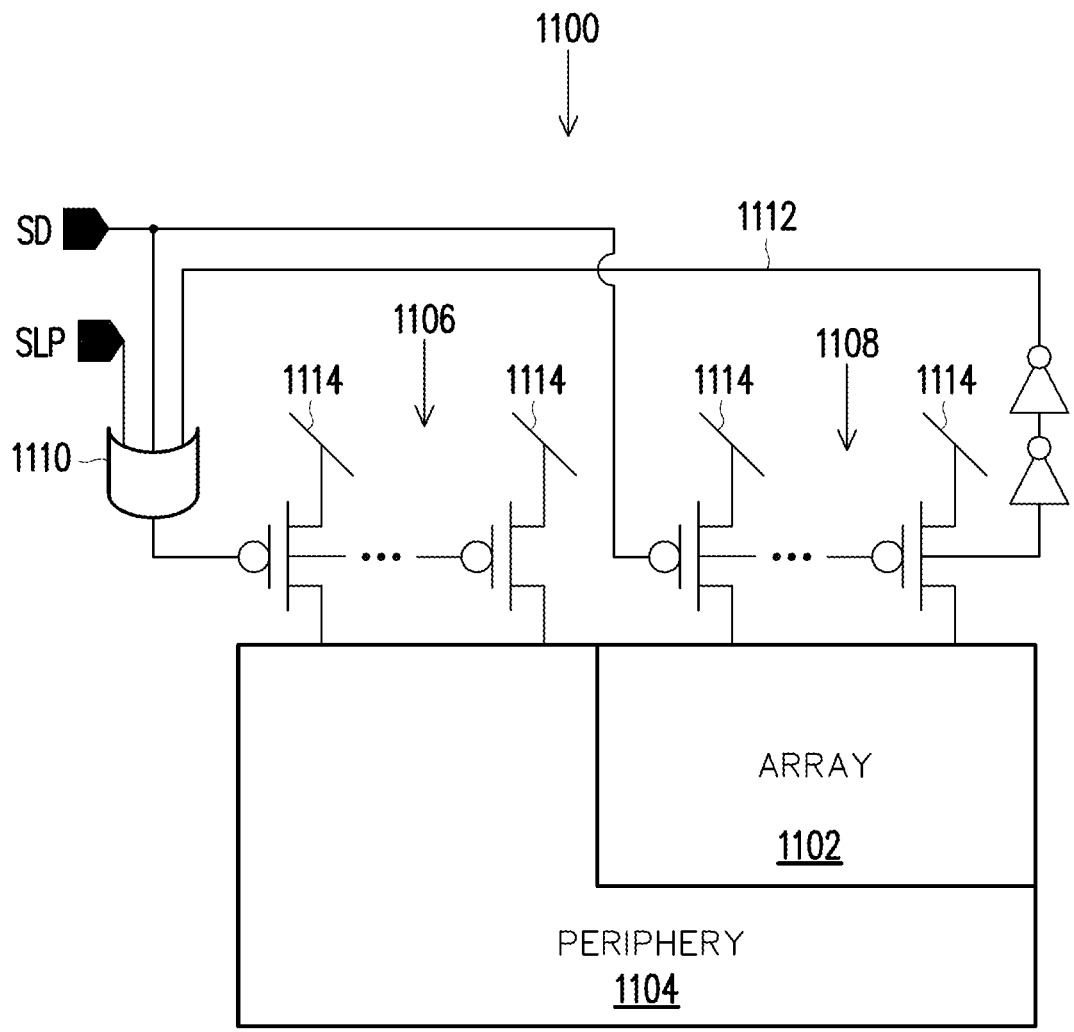
FIG. 11 illustrates a block diagram of a memory device and circuitry for power management in accordance with some embodiments.

FIG. 11 illustrates a block diagram of a memory device and circuitry for power management in accordance with some embodiments. The memory device 1100 includes a memory array 1102 and periphery circuitry 1104 that includes the circuitry to perform read and write operations along with one or more of column multiplexing, testing, bit-write operations, and/or byte write operations. Periphery header circuits 1106 are operably connected between the periphery circuitry 1104 and a power supply voltage 1114. The array header circuits 1108 are operably connected between the memory array 1102 and the power supply voltage 1114. Any suitable header circuit can be used as the periphery and array header circuits 1106, 1108. For example, in the illustrated embodiment, the periphery and array header circuits 1106, 1108 are implemented with p-type transistors.

The inputs of a logic circuit 1110 (e.g., AND circuit) are operably connected to a shutdown signal (SD), a sleep signal (SLP), and array header circuit signal 1112. The output of the logic circuit 1110 is operably connected to the periphery header circuits 1106 (e.g., the gates of the p-type transistors). The SD signal is operably connected to the array header circuits 1108 (e.g., the gates of the p-type transistors).

The memory device 1100 can have three modes of operations. In a normal mode, the signal levels of the shutdown (SD) signal and the sleep (SLP) signal are both low and the periphery header circuits 1106 and the array header circuits 1108 on. The periphery circuitry 1104 and the memory array 1102 are fully operational in the normal mode in that a power supply voltage 1114 is operably connected to the periphery circuitry 1104 and the memory array 1102.

In a sleep mode, the signal level of SD is low and the signal level of SLP is high. The periphery header circuits 1106 are off in the sleep mode so the periphery circuitry 1104 is not operably connected to the power supply voltage 1114. The array header circuits 1108 are on in the sleep mode and the memory array 1102 is operably connected to the power supply voltage 1114.

In a shutdown mode, both the signal level of SD and the signal level of SLP are high. The periphery header circuits 1106 and the array header circuits 1108 are off in the shutdown mode so the periphery circuitry 1104 and the memory array 1102 are not operably connected to the power supply voltage 1114.

Figure 12:
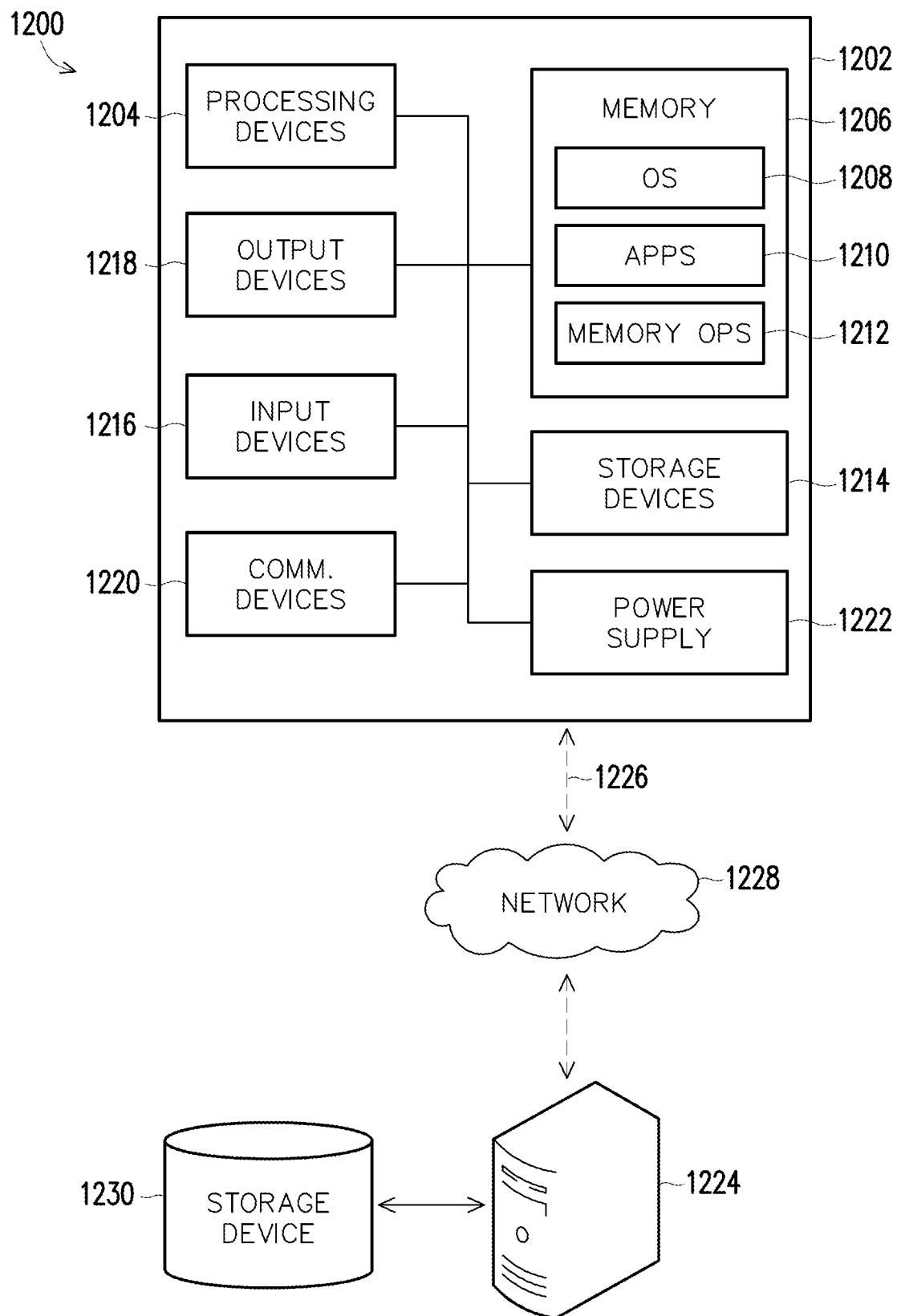
FIG. 12 depicts an example system that can include one or more memory devices in accordance with some embodiments.

FIG. 12 depicts an example system that can include one or more memory devices in accordance with some embodiments. The system 1200 includes an electronic device 1202. In a basic configuration, the electronic device 1202 may include at least one processing device 1204 and a system memory device 1206. Any suitable processing device can be used. For example, the processing device 1204 may be a microprocessor, a central processor, an application-specific integrated circuit, a field programmable gate array, or combinations thereof.

Depending on the configuration and type of the electronic device 1202, the system memory device 1206 may comprise, but is not limited to, volatile storage (e.g., random access memory), non-volatile storage (e.g., read-only memory), flash memory, or any combination of such memories. The system memory device 1206 may include a number of data files and processor or computer-executable instructions of program modules, such as processor or computer-executable instructions associated with an operating system (OS) 1208, one or more software programs (APPS) 1210 suitable for parsing received input, determining subject matter of received input, determining actions associated with the input and so on, and memory operations 1212 for performing some or all of the memory operations disclosed herein. When executed by the processing device(s) 1204, the processor or computer-executable instructions may perform and/or cause to be performed processes including, but not limited to, the aspects as described herein.

The OS 1208, for example, may be suitable for controlling the operation of the electronic device 1202. Furthermore, embodiments may be practiced in conjunction with a graphics library, other operating systems, or any other application program and is not limited to any particular application or system.

The electronic device 1202 may have additional features or functionality. For example, the electronic device 1202 may also include additional removable and/or non-removable data storage devices 1214 such as, for example, magnetic disks, optical disks, tape, and/or memory cards or sticks.

The electronic device 1202 may also have one or more input devices 1216 and one or more output devices 1218. Example input devices 1216 include, but are not limited to, a keyboard, a trackpad, a mouse, a pen, a sound or voice input device, and/or a touch, force and/or swipe input device. The output device(s) 1218 can be one or more displays, one or more speakers, a printer, headphones, haptic or tactile feedback device, and the like. The electronic device 1202 may include one or more communication devices 1220 allowing communications with other electronic devices. Examples communication devices 1220 include, but are not limited to, radio frequency (RF) transmitter, receiver, and/or transceiver circuitry (e.g., WiFi), universal serial bus (USB), parallel and/or serial ports, cellular devices, near field communication devices, and short range wireless devices.

The electronic device 1202 further includes a power supply 1222, which may be implemented as an external power source, such as an AC adapter. Additionally or alternatively, the power supply 1222 may include one or more batteries or a powered docking cradle that supplements or recharges the batteries.

The system memory 1206 and the storage device(s) 1214 may include RAM, ROM, electrically erasable read-only memory (EEPROM), flash memory or other memory technology, CD-ROM, digital versatile disks (DVD) or other optical storage, magnetic cassettes, magnetic tape, magnetic disk storage or other magnetic storage devices, or any other article of manufacture which can be used to store information and which can be accessed by the electronic device 1202. Any such memory or storage device may be part of the electronic device 1202 or electrically connected to the electronic device 1202.

Furthermore, embodiments may be practiced in an electrical circuit comprising discrete electronic elements, packaged or integrated electronic chips containing logic gates, a circuit utilizing a microprocessor, or on a single chip containing electronic elements or microprocessors. For example, embodiments of the disclosure may be practiced via a system-on-a-chip (SOC) where each or many of the components illustrated in FIG. 12 may be integrated onto a single integrated circuit. Such an SOC device may include one or more processing units, graphics units, communications units, system virtualization units and various application functionality all of which are integrated (or "burned") onto the chip substrate as a single integrated circuit.

When operating via an SOC, the functionality, described herein, with respect to memory operations, may be operated via application-specific logic integrated with other components of the electronic device 1202 on the single integrated circuit (chip). Embodiments of the disclosure may also be practiced using other technologies capable of performing logical operations such as, for example, AND, OR, and NOT, including but not limited to mechanical, optical, fluidic, and quantum technologies. In addition, embodiments may be practiced within a general purpose computer or in any other circuits or systems.

In some embodiments, the electronic device 1202 optionally accesses (optional connection and access indicated by dashed line 1226) one or more server-computing devices (represented by server-computing device 1224) through a wired and/or wireless connection to one or more networks (represented by network 1228). The server-computing device 1224 can interact with various programs or services stored on one or more storage devices (represented by storage device 1230) and executed by the server-computing device 1224.

In one or more embodiments, the network 1228 is illustrative of any type of network, for example, an intranet and/or a distributed computing network (e.g., the Internet). The electronic device 1202 can be a personal or handheld computing device or a desktop computing device. For example, the electronic device 1202 may be a smart phone, a tablet, a wearable device, a desktop computer, a laptop computer, and/or a server (individually or in combination).

This list of electronic devices is for example purposes only and should not be considered as limiting. Any electronic device that provides and/or interacts with one or more modeling programs or services may be utilized.

Although the figures depict certain components, values, and signal levels, other embodiments are not limited to these components, values, and signal levels. For example, FIG. 9 depicts a logic circuit as an AND circuit. Other embodiments can use a different type of logic circuit. In another example, the latches are shown as constructed with certain components. Other embodiments can use a different type of latch or a different type of storage device.

Additionally, embodiments disclosed herein can be used with any suitable memory device. One example of such a memory device is a SRAM device.

In one aspect, a memory device includes one or more memory cells. Each memory cell is a twelve-transistor (12T) memory cell that includes a transmission gate, a cross-coupled inverter circuit operably connected to the transmission gate, and a tri-state inverter operably connected to the cross-coupled inverter circuit. The cross-coupled inverter includes another tri-state inverter cross-coupled to an inverter circuit.

In another aspect, a method for writing data to a 12T memory cell includes based on an address, reading data from a memory cell associated with the address and storing the data in a first storage device. Input data to be written to the memory cell is received and stored in a second storage device. Mask data that indicates whether a write operation is to be a masked write operation or an unmasked write operation is received. When the mask data indicates the write operation is a masked write operation, the data stored in the first storage device is received and written to the memory cell. When the mask data indicates the write operation is an unmasked write operation, the input data stored in the second storage device is received and written to the memory cell.

In yet another aspect, an electronic device includes a processing device and a memory device operably connected to the processing device. The memory device includes one or more memory cells. Each memory cell is a twelve-transistor (12T) memory cell that includes a transmission gate, a cross-coupled inverter circuit operably connected to the transmission gate, and a tri-state inverter operably connected to the cross-coupled inverter circuit. The cross-coupled inverter includes another tri-state inverter cross-coupled to an inverter circuit.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
   a memory cell comprising:
      a transmission gate;
      a cross-coupled inverter circuit operably connected to the transmission gate, the cross-coupled inverter comprising a first tri-state inverter cross-coupled to an inverter; and
      a second tri-state inverter operably connected to an output of the inverter in the cross-coupled inverter circuit;
   a select circuit, wherein an output of the select circuit is operably connected to a first bit line associated with the memory cell; and
   a memory cell storage device, wherein:
      an input of the memory cell storage device is operably connected to a second bit line associated with the memory cell; and
      an output of the memory cell storage device is operably connected to an input of the select circuit.

2. The memory device of claim 1, wherein the memory device comprises a static random-access memory device.

3. The memory device of claim 1, wherein the transmission gate and the cross-coupled inverter circuit comprise a write port and the second tri-state inverter comprises a read port.

4. The memory device of claim 3, wherein:
   the transmission gate comprises an n-type transistor operably connected in parallel to a p-type transistor;
   the first tri-state inverter comprises two p-type transistors connected in series and two n-type transistors connected in series, wherein the two p-type transistors and the two n-type transistors are connected in series;
   the inverter comprises a p-type transistor connected in series with an n-type transistor; and
   the second tri-state inverter comprises two p-type transistors connected in series and two n-type transistors connected in series, wherein the two p-type transistors and the two n-type transistors are connected in series.

5. The memory device of claim 4, wherein one or more threshold voltages of the n-type and the p-type transistors in the write port differ from one or more threshold voltages of the n-type and the p-type transistors in the read port.

6. The memory device of claim 1, wherein:
   the input of the select circuit comprises a first input of the select circuit; and
   the memory device further comprises:
      an input storage device for storing input data to be written to the memory cell;
      a mask storage device for storing mask data indicating whether a write operation to the memory cell is to be masked; and
      an output storage device, wherein:
         the output of the memory cell storage device is operably connected to an input of the output storage device;
         an output of the input storage device is operably connected to a second input of the select circuit; and
         an output of the mask storage device is operably connected to a select input of the select circuit.

7. The memory device of claim 6, wherein the input storage device, the memory cell storage device, the mask storage device, and the output storage device each comprises a latch circuit and the select circuit comprises a multiplexer.

8. The memory device of claim 6, further comprising a driver circuit, wherein an input of the driver circuit is operably connected to the output of the input storage device and an output of the driver circuit is operably connected to the input of the memory cell storage device.

9. The memory device of claim 1, wherein:
the memory cell is included in a memory array, the memory array comprising a plurality of memory cells grouped into multiple sub-arrays, wherein each sub-array includes a subset of memory cells;
a plurality of local read bit lines, wherein each local read bit line is operably connected to the subset of memory cells in a respective sub-array; and
a global read bit line, wherein the plurality of local read bit lines is operably connected to the global read bit line.

10. The memory device of claim 1, wherein:
the select circuit comprises a first select circuit; and
the memory device further comprises:
  a second select circuit; and
  a logic circuit, wherein:
    an input of the second select circuit is operably connected to the output of the memory cell storage device;
    an output of the logic circuit is operably connected to a select input of the first select circuit;
    a first input of the logic circuit is operably connected to a column select signal line;
    a second input of the logic circuit is operably connected to a mask data input; and
    the column select signal line is operably connected to a select input of the second select circuit.

11. The memory device of claim 10, wherein the first and the second select circuits each comprise a multiplexer, the logic circuit comprises an AND circuit, and the memory cell storage device comprises a latch circuit.

12. A system, comprising:
one or more processing devices; and
at least one memory storing instructions, that when executed by the one or more processing devices, cause operations to be performed, the operations comprising:
  based on an address, reading data from a memory cell associated with the address;
  storing the data in a first storage device;
  receiving input data to be written to the memory cell;
  storing the input data in a second storage device;
  receiving mask data associated with the memory cell, the mask data indicating whether a write operation is to be a masked write operation or an unmasked write operation;
  when the mask data indicates the write operation is a masked write operation, receiving the data stored in the first storage device and writing the data to the memory cell; and
  when the mask data indicates the write operation is an unmasked write operation, receiving the input data stored in the second storage device and writing the input data to the memory cell.

13. The system of claim 12, wherein the at least one memory stores further instructions for storing the mask data in a third storage device.

14. The system of claim 13, wherein the first storage device, the second storage device, and the third storage device each comprise a latch circuit.

15. An electronic device, comprising:
a processing device; and
a memory device operably connected to the processing device, the memory device comprising:
  a memory cell, comprising:
    a transmission gate;
    a cross-coupled inverter circuit operably connected to the transmission gate, the cross-coupled inverter comprising a first tri-state inverter cross-coupled to an inverter; and
    a second tri-state inverter operably connected to an output of the inverter in the cross-coupled inverter circuit;
  a select circuit, wherein an output of the select circuit is operably connected to a first bit line associated with the memory cell; and
  a memory cell storage device for storing data read from the memory cell, wherein:
    an input of the memory cell storage device is operably connected to a second bit line associated with the memory cell; and
    an output of the memory cell storage device is operably connected to an input of the select circuit.

16. The electronic device of claim 15, wherein the memory device comprises a static random-access memory device.

17. The electronic device of claim 15, wherein the memory cell comprises a twelve transistor memory cell.

18. The electronic device of claim 17, wherein:
the transmission gate and the cross-coupled inverter circuit comprise a write port;
the second tri-state inverter comprises a read port; and
one or more threshold voltages of transistors in the write port differ from one or more threshold voltages of transistors in the read port.

19. The electronic device of claim 15, wherein:
the input of the select circuit comprises a first input of the select circuit; and
the memory device further comprises:
  an input storage device for storing input data to be written to the memory cell;
  a mask storage device for storing mask data indicating whether a write operation to the memory cell is to be masked; and
  an output storage device, wherein:
    the output of the memory cell storage device is operably connected to an input of the output storage device;
    an output of the input storage device is operably connected to a second input of the select circuit; and
    an output of the mask storage device is operably connected to a select input of the select circuit.

20. The electronic device of claim 15, wherein:
the select circuit comprises a first select circuit; and
the memory device further comprises:
  a second select circuit; and
  a logic circuit, wherein:
    an input of the second select circuit is operably connected to the output of the memory cell storage device;
    an output of the logic circuit is operably connected to a select input of the first select circuit;

a first input of the logic circuit is operably connected to a column select signal line; a second input of the logic circuit is operably connected to a mask data input; and the column select signal line is operably connected to a select input of the second select circuit.

* * * * *